US008823018B2

(12) United States Patent
Yoneyama et al.

(10) Patent No.: US 8,823,018 B2
(45) Date of Patent: Sep. 2, 2014

(54) SEMICONDUCTOR MODULE INCLUDING A SWITCHING ELEMENT FORMED OF A WIDE BANDGAP SEMICONDUCTOR

(75) Inventors: Rei Yoneyama, Tokyo (JP); Hiroyuki Okabe, Tokyo (JP); Takahiro Inoue, Tokyo (JP); Shinji Sakai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/600,910

(22) Filed: Aug. 31, 2012

(65) Prior Publication Data

US 2013/0161644 A1     Jun. 27, 2013

(30) Foreign Application Priority Data

Dec. 22, 2011   (JP) ................. 2011-280836

(51) Int. Cl.
*H01L 29/15* (2006.01)
*H01L 31/0312* (2006.01)
*H01L 29/16* (2006.01)
*H01L 29/66* (2006.01)
*H01L 29/78* (2006.01)

(52) U.S. Cl.
CPC ....... *H01L 29/1608* (2013.01); *H01L 29/66068* (2013.01); *H01L 29/1602* (2013.01); *H01L 29/7802* (2013.01); *H01L 29/6606* (2013.01)
USPC ........................................... 257/77

(58) Field of Classification Search
CPC ............... H01L 29/1608; H01L 29/66068; H01L 29/1602; H01L 29/7802; H01L 29/6606
USPC ........................................... 257/77
See application file for complete search history.

(56) References Cited

U.S. PATENT DOCUMENTS

2008/0258252 A1* 10/2008 Shimizu et al. ............... 257/476
2010/0265746 A1   10/2010 Ishikawa et al.

FOREIGN PATENT DOCUMENTS

| JP | 2008-61404 | | 3/2008 |
| JP | 2008061404 A | * | 3/2008 |
| JP | 2010-200401 | | 9/2010 |
| JP | 2010-252568 | | 11/2010 |
| JP | 2011-30424 | | 2/2011 |
| JP | 2011-36020 | | 2/2011 |

OTHER PUBLICATIONS

Office Action issued Jul. 8, 2014 to Japanese Patent Application No. 2011-280836, with partial English translation.

* cited by examiner

*Primary Examiner* — Anthony Ho
(74) *Attorney, Agent, or Firm* — Oblon, Spivak, McClelland, Maier & Neustadt, L.L.P.

(57) ABSTRACT

Provided is a semiconductor module having high inrush-current tolerance. A semiconductor module includes a switching element formed of a wide bandgap semiconductor, and a free wheel diode connected in antiparallel with the switching element, wherein the free wheel diode is made of silicon and has negative temperature characteristics.

7 Claims, 4 Drawing Sheets

F I G. 4
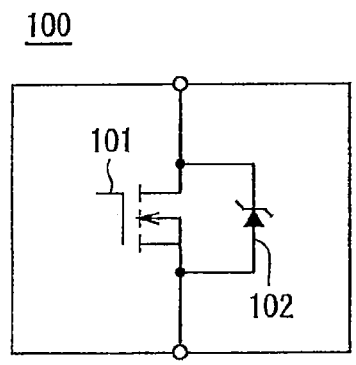
F I G. 5
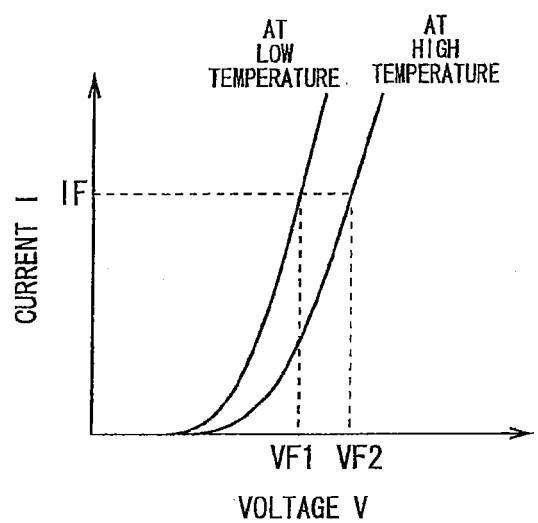

SEMICONDUCTOR MODULE INCLUDING A SWITCHING ELEMENT FORMED OF A WIDE BANDGAP SEMICONDUCTOR

BACKGROUND OF THE INVENTION

1. Field of the Invention

The present invention relates to a semiconductor module including a switching element formed of a wide bandgap semiconductor.

2. Description of the Background Art

As a next-generation switching element capable of realizing high withstand voltage, a low loss, and high heat resistance, a semiconductor device using silicon carbide (SiC) has been considered promising and expected to be applied to a power semiconductor module such as an inverter.

For example, Japanese Patent Application Laid-Open No. 2008-61404 proposes a current converter using a switching element formed of a wide bandgap semiconductor such as SiC.

Each switching element is connected in antiparallel with a free wheel diode in order to prevent destruction due to a surge current. In Japanese Patent Application Laid-Open No. 2010-252568, a Schottky barrier diode as a free wheel diode is formed of a wide bandgap semiconductor such as SiC, to reduce a recovery current of the free wheel diode, thus seeking reduction in switching loss.

SUMMARY OF THE INVENTION

However, when the SiC Schottky barrier diode (SiC-SBD) is used as the free wheel diode of the SiC switching element as in Japanese Patent Application Laid-Open No. 2010-252568, there has been a problem that a generated loss with respect to an inrush current is large. Since the SiC-SBD has positive temperature characteristics, when a large current flows and its temperature gets high, a forward voltage VF increases. This leads to an increase in generated loss (IF×VF) with respect to the inrush current. When the temperature of the device rises due to the increase in generated loss, the voltage VF increases, and the generated loss further increases due to the increase in VF. The device thus enters the state of such a positive feedback.

Thus, with the semiconductor module fully made of SiC which uses the free wheel diode being the SiC-SBD for the SiC switching element, there has been a problem in that the module needs to be actually used with a loss not higher than an allowable loss, and hence an operation temperature range and an inrush current value are restricted in practical use.

SUMMARY

It is an object of the present invention to provide a semiconductor module having high inrush-current tolerance.

A semiconductor module of the present invention includes a switching element and a free wheel diode. The switching element is formed of a wide bandgap semiconductor. The free wheel diode is connected in antiparallel with the switching element and made of silicon, and has negative temperature characteristics.

In the semiconductor module of the present invention, since the free wheel diode is made of silicon and has negative temperature characteristics, the diode does not enter the state of a positive feedback versus an inrush current, and thereby has high resistance.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a circuit diagram of a semiconductor module according to an underlying technique;

FIG. 5 is a diagram showing temperature characteristics of a SiC Schottky barrier diode.

DESCRIPTION OF THE PREFERRED EMBODIMENTS

A. Underlying Technique

FIG. 4 is a circuit diagram of a semiconductor module 100 according to an underlying technique. The semiconductor module 100 includes a SiC MOSFET 101, and a SiC Schottky barrier diode (SiC-SBD) 102 connected as a free wheel diode in antiparallel with MOSFET 101.

FIG. 5 shows a change in V-I characteristics of the SiC-SBD 102 associated with a temperature. FIG. 5 shows a V-I characteristic at the time of low temperature and a V-I characteristic at the time of high temperature. A forward voltage VF versus an inrush current IF increases to VF2 at the time of high temperature with respect to VF1 at the time of low temperature (VF1<VF2). As described above, the SiC-SBD 102 has positive temperature characteristics.

Figure 6:
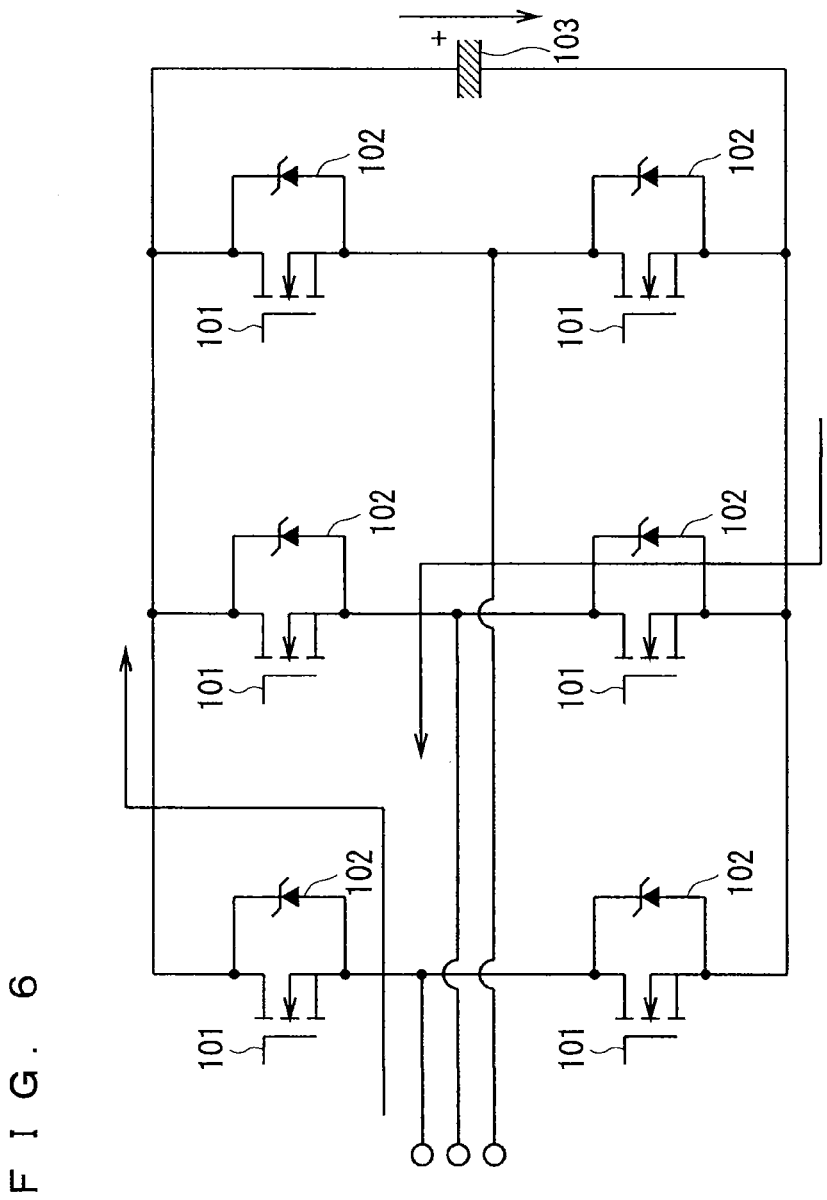
FIG. 6 is a circuit diagram of a semiconductor module according to an underlying technique.

FIG. 6 shows a circuit of a converter using a plurality of semiconductor modules 100. The plurality of semiconductor modules 100 are connected in parallel with a capacitor 103. In the transient state of the capacitor 103 being charged at the time of turning on the power, an inrush current flows in a direction indicated by an arrow in FIG. 6, for example. The larger the capacity of the capacitor 103 is, the larger the value of the inrush current becomes. When a temperature of the SiC-SBD 102 rises due to the flow of the large inrush current, VF increases, and the generated loss IF×VF increases as shown in FIG. 5. When the generated loss increases, the temperature further rises, to cause an increase in VF, and when VF increases, the generated loss increases again. The diode thus enters the state of such a positive feedback.

In order to solve the above problems, a semiconductor module of the present invention has a configuration to use a device having negative temperature characteristics as a free wheel diode.

B. First Preferred Embodiment

<B-1. Configuration, Operation>

Figure 1:
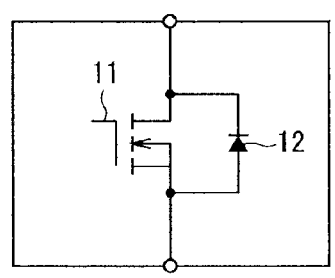
FIG. 1 is a circuit diagram of a semiconductor module according to a first preferred embodiment.

FIG. 1 is a circuit diagram of a semiconductor module 10 of a first preferred embodiment. The semiconductor module 10 includes a SiC MOSFET 11, and a Si PN diode 12 connected as a free wheel diode in antiparallel with MOSFET 11.

Figure 2:
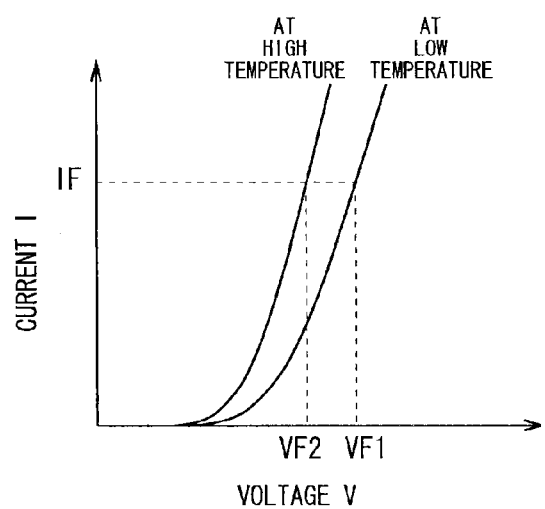
FIG. 2 is a diagram showing temperature characteristics of a free wheel diode in the semiconductor module according to the first preferred embodiment.

FIG. 2 shows a change in V-I characteristics of the PN diode 12 associated with a temperature. FIG. 2 shows a V-I characteristic at the time of low temperature and a V-I characteristic at the time of high temperature. A forward voltage VF versus a predetermined current IF decreases to VF2 at the time of high temperature with respect to VF1 at the time of low temperature (VF1>VF2). As described above, since the Si PN diode 12 has negative temperature characteristics, it has a characteristic of VF decreasing with rise in temperature. For this reason, when a large current such as an inrush current flows, a temperature of the PN diode 12 rises while its VF decreases, thereby suppressing a generated loss (IF×VF).

It is therefore possible to improve inrush-current tolerance of the semiconductor module 10 as compared with the case of using a SiC diode having positive temperature characteristics as the free wheel diode of the SiC MOSFET 11.

<B-2. Modified Example>

It is to be noted that, although the Si PN diode 12 has been used as the free wheel diode, another diode may be used as the free wheel diode so long as it has negative temperature characteristics and, for example, a Si PiN diode may be used. In the PiN diode, providing a carrier accumulation layer in a PN junction causes occurrence of conductivity modulation, to allow a further decrease in VF than in the PN diode. It is thus possible to further improve the inrush-current tolerance of the semiconductor module than in the case of using the PN diode. Moreover, it is possible to suppress a generated loss at the time of operation, to realize a low loss.

Furthermore, a material for the MOSFET 11 as the switching element is not limited to SiC, but may be another wide bandgap semiconductor such as a gallium nitride-based material or diamond.

<B-3. Effect>

According to the semiconductor module of the present invention, the following effect is obtained. That is, the semiconductor module 10 according to the present invention includes the MOSFET 11 (switching element) formed of a wide bandgap semiconductor, and the PN diode 12 (free wheel diode) connected in antiparallel with the switching element. Since the free wheel diode is made of silicon and has negative temperature characteristics, the diode does not enter the state of the positive feedback versus the inrush current, and thereby has high resistance.

Further, since the PN diode or the PiN diode made of silicon having negative temperature characteristics is used as the free wheel diode, the diode does not enter the state of the positive feedback versus the inrush current, and thereby has high resistance.

Moreover, since the wide bandgap semiconductor constituting the MOSFET 11 contains a gallium nitride-based material or diamond other than SiC, it is possible to improve resistance to the inrush current in the semiconductor module including the switching element formed of these wide bandgap semiconductors.

C. Second Preferred Embodiment

<C-1. Configuration, Operation>

Figure 3:
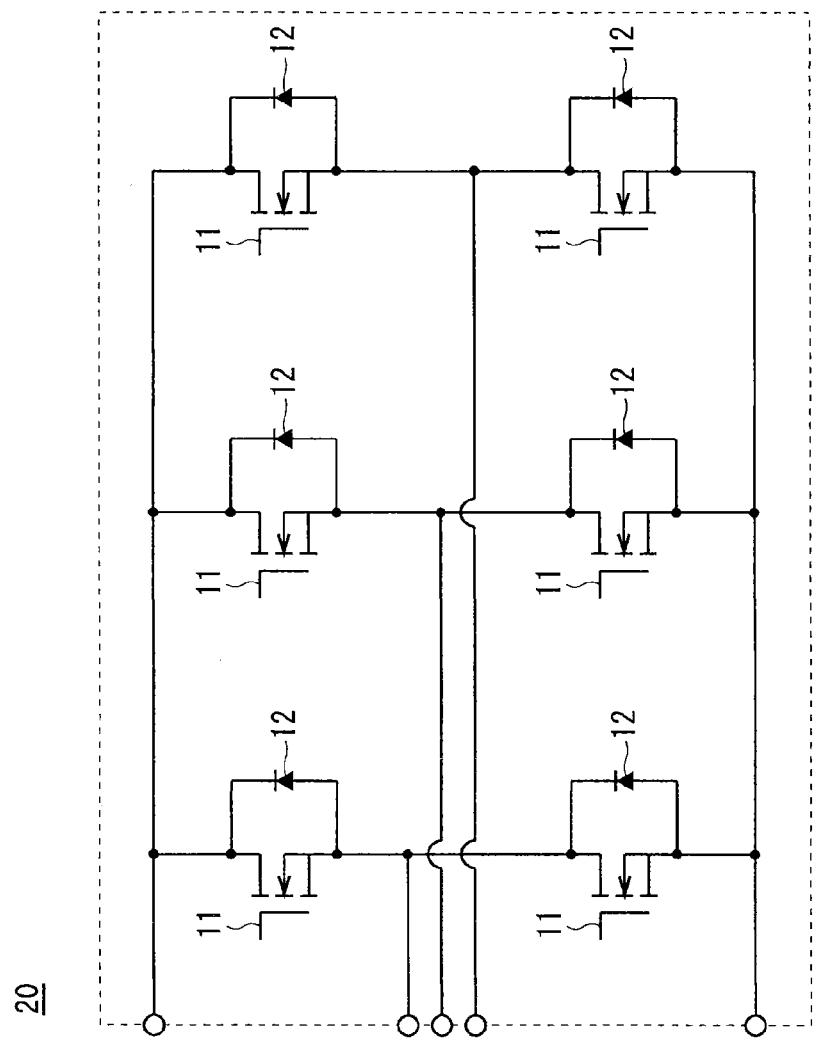
FIG. 3 is a circuit diagram of a semiconductor module according to a second preferred embodiment.

FIG. 3 is a circuit diagram of a semiconductor module 20 according to the second preferred embodiment. In the semiconductor module 20, two semiconductor modules 10 are connected in series between power connection terminals, and the two semiconductor modules 10 are further connected in three-parallel form corresponding to three-phase loads. By putting together a plurality of semiconductor modules 10 of the first preferred embodiment in one package as described above, reduction in size of the semiconductor module can be achieved.

<C-2. Effect>

The semiconductor module of the present preferred embodiment includes in one package a plurality of pairs of the switching element 11 and the free wheel diode 12 of the first preferred embodiment, whereby reduction in size of the semiconductor module can be achieved.

While the invention has been shown and described in detail, the foregoing description is in all aspects illustrative and not restrictive. It is therefore understood that numerous modifications and variations can be devised without departing from the scope of the invention.

What is claimed is:

1. A semiconductor module comprising:
    a switching element formed of a wide bandgap semiconductor; and
    only one free wheel diode connected in antiparallel with said switching element, wherein
    said only one free wheel diode is a diode made of silicon and has negative temperature characteristics so that when a large inrush current flows the forward voltage does not increase and the semiconductor module does not enter a positive feedback state.

2. The semiconductor module according to claim 1, wherein said free wheel diode is a PN diode or a PiN diode.

3. The semiconductor module according to claim 1, wherein said wide bandgap semiconductor contains silicon carbide.

4. The semiconductor module according to claim 1, comprising a plurality of pairs of said switching element and said free wheel diode in one package.

5. The semiconductor module according to claim 1, wherein said wide bandgap semiconductor contains a gallium nitride-based material.

6. The semiconductor module according to claim 1, wherein said wide bandgap semiconductor contains diamond other than SiC.

7. The semiconductor module according to claim 1, wherein said switching element is a MOSFET switching element.

* * * * *